US010447250B2

(12) United States Patent
Bagger

(10) Patent No.: US 10,447,250 B2
(45) Date of Patent: Oct. 15, 2019

(54) MULTI-STAGE FREQUENCY DIVIDERS AND POLY-PHASE SIGNAL GENERATORS

(71) Applicant: Telefonaktiebolaget LM Ericsson (publ), Stockholm (SE)

(72) Inventor: Reza Bagger, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/522,032

(22) PCT Filed: Dec. 2, 2015

(86) PCT No.: PCT/SE2015/051296
§ 371 (c)(1),
(2) Date: Apr. 26, 2017

(87) PCT Pub. No.: WO2016/089291
PCT Pub. Date: Jun. 9, 2016

(65) Prior Publication Data
US 2017/0324414 A1  Nov. 9, 2017

(30) Foreign Application Priority Data
Dec. 2, 2014 (WO) .................. PCT/SE2014/051430

(51) Int. Cl.
*H03K 3/356* (2006.01)
*H03K 3/3562* (2006.01)
(Continued)

(52) U.S. Cl.
CPC ....... *H03K 3/356104* (2013.01); *H03K 3/356* (2013.01); *H03K 3/35625* (2013.01);
(Continued)

(58) Field of Classification Search
CPC .............. H03K 5/15; H03K 3/356104; H03K 3/356139; H03K 3/35625; H03K 3/356
(Continued)

(56) References Cited

U.S. PATENT DOCUMENTS 6,163,182 A    12/2000  Canard et al.
7,298,183 B2   11/2007  Mirzaei et al.
(Continued)

FOREIGN PATENT DOCUMENTS

WO    2007004181 A2    1/2007
WO    2011003101 A1    1/2011
WO    2013073268 A1    5/2013

OTHER PUBLICATIONS

International Search Report and Written Opinion for International Patent Application No. PCT/SE2015/051296, dated Feb. 26, 2016, 10 pages.
(Continued)

*Primary Examiner* — Hai L Nguyen
(74) *Attorney, Agent, or Firm* — Withrow & Terranova, PLLC

(57) ABSTRACT

An electronic latch circuit, a 4-phase signal generator, a multi-stage frequency divider and a poly-phase signal generator are disclosed. The electronic latch circuit comprises an output circuit comprising a first output and a second output. The electronic latch circuit further comprises an input circuit comprising a first input, a second input and a clock signal input. The electronic latch circuit is configured to change state based on the input signals' level at the inputs of the input circuit and a present state of the output circuit. The 4-phase signal generator is built with two electronic latch circuits. The multi-stage frequency dividers and poly-phase signal generators comprise a plurality of the electronic latch circuits and 4-phase signal generators.

3 Claims, 16 Drawing Sheets

(51) Int. Cl.

| | |
|---|---|
| *H03K 21/10* | (2006.01) |
| *H03K 23/42* | (2006.01) |
| *H03K 19/20* | (2006.01) |
| *H04B 1/40* | (2015.01) |
| *H03K 5/15* | (2006.01) |
| *H03K 3/37* | (2006.01) |
| *H03K 23/48* | (2006.01) |

(52) U.S. Cl.
CPC ......... *H03K 3/356139* (2013.01); *H03K 3/37* (2013.01); *H03K 5/15066* (2013.01); *H03K 19/20* (2013.01); *H03K 21/10* (2013.01); *H03K 23/425* (2013.01); *H04B 1/40* (2013.01); *H03K 23/483* (2013.01)

(58) Field of Classification Search
USPC .................................................. 327/115, 117
See application file for complete search history.

(56) References Cited

U.S. PATENT DOCUMENTS

| | | | |
|---|---|---|---|
| 7,425,850 | B2 | 9/2008 | Widerin |
| 7,521,976 | B1 | 4/2009 | Sudjian et al. |
| 8,203,367 | B2 | 6/2012 | Leoncavallo |
| 8,237,485 | B2 | 8/2012 | Meng et al. |
| 8,487,682 | B2 | 7/2013 | Du et al. |
| 8,791,729 | B2 * | 7/2014 | Woelk .................... H03K 23/42 327/117 |
| 8,884,665 | B2 * | 11/2014 | Lin .................... H03K 5/15013 327/115 |
| 10,177,748 | B2 | 1/2019 | Bagger |
| 2004/0012416 | A1 | 1/2004 | Cheung et al. |
| 2009/0068975 | A1 | 3/2009 | Luong et al. |
| 2011/0234266 | A1 | 9/2011 | Tsai |
| 2017/0244393 | A1 | 8/2017 | Bagger |

OTHER PUBLICATIONS

Fabiano, I. et al., "Saw-Less Analag Front-End Receivers for TDD and FDD," 2013 IEEE International Solid-State circuits Conference, ISSCC 2013, Session 5, RF Techniques, 5.1, Feb. 18, 2013.
Magoon, R., et at. "RF Local Oscillator Path for GSM Direct Conversion Transceiver With True 50% Duty Cycle Divide by Three and Active Third Harmonic Cancellation," IEEE Radio Frequency Integrated Circuits Symposium, Jun. 17, 2002, Montreal, Canada, pp. 23-26.
Nejdel, A., et al., "A 0.7-3.7 GHz Six Phase Receiver Front-End With Third Order Harmonic Rejection," 2013 Proceedings of the 39th European Solid-State Circuits Conference, Sep. 16, 2013, Bucharest, Romania, pp. 279-282.
Razavi, Behzad et al., "Design of High-Speed, Low-Power Frequency Dividers and Phase-Locked Loops in Deep Submicron CMOS," IEEE Journal of Solid-State Circuits, vol. 30, Issue 2, Feb. 1995, IEEE, pp. 101-109.
Zhou, C., et al., "A 50% duty cycle wide-locking range divide-by-3 divider up to 6 GHz," 2011 IEEE Radio Frequency Integrated Circuits Symposium (RFIC), Jul. 5, 2011, Baltimore, Maryland, pp. 1-4.
Notice of Allowance for U.S. Appl. No. 15/524,375, dated Sep. 7, 2018, 9 pages.
International Search Report and Written Opinion for International Patent Application No. PCT/SE2014/051430, dated Aug. 13, 2015, 18 pages.
Non-Final Office Action for U.S. Appl. No. 15/517,574, dated Jul. 6, 2018, 13 pages.
Notice of Allowance for U.S. Appl. No. 15/517,574, dated Dec. 10, 2018, 7 pages.
Corrected Notice of Allowability for U.S. Appl. No. 15/517,574, dated Jan. 11, 2019, 4 pages.
International Search Report and Written Opinion for International Patent Application No. PCT/SE2015/050489, dated Dec. 11, 2015, 10 pages.

\* cited by examiner

MULTI-STAGE FREQUENCY DIVIDERS AND POLY-PHASE SIGNAL GENERATORS

This application is a 35 U.S.C. § 371 national phase filing of International Application No. PCT/SE2015/051296, filed Dec. 2, 2015, which claims priority to International Application No. PCT/SE2014/051430, filed Dec. 2, 2014, the disclosures of which are incorporated herein by reference in their entireties.

TECHNICAL FIELD

Embodiments herein relate to an electronic latch circuit and circuits comprising the electronic latch circuit. They relate generally to multi-stage frequency dividers and poly-phase signal generators comprising a plurality of the electronic latch circuits. Particularly, they can be used for generating poly-phase signals for harmonic rejection mixers in transceivers and for electronic devices in need of $1/(2^N)$ frequency division and $2^{N+1}$ poly-phase signals, wherein N=1, 2, . . . .

BACKGROUND

Nowadays, multi-standard broad band transceiver is an emerging topology in cellular telecommunication systems. Moreover, high performance is required with several standards with stringent specification among the targeted applications. The subject is further complicated by requirements on more compact form factor and on design approaches toward more integration. Moreover, Complementary Metal Oxide Semiconductor, CMOS low quality factor components are limiting the performance of many circuit techniques. Consequently new architectures and circuit techniques must be explored.

To address some of the mentioned issues in the wireless transceivers, In-phase and Quadrature-phase, I/Q modulator and Harmonic Rejection Mixers, HRM have recently gained attention. Indeed the vast majority of transceivers fall into I/Q modulator based receivers and transmitters. These modulators use In-phase and Quadrature-phase mixers. I/Q mixers address the problem of maximizing information transmission in a limited bandwidth by allowing the operator to modulate both the in-phase and quadrature phase components of a carrier simultaneously, doubling the information density.

In order to drive an I/Q mixer, in one approach, a divider able to create 25% duty cycle signals from an externally supplied clock at $2*f_{LO}$ is often used, where $f_{LO}$ is the frequency of local oscillator, LO signal input to the mixer. A divide-by-2 circuitry which generates 4 phase signals with 25% duty cycle is an example of a 4-phase signal generator.

Conventional switching mixers introduce relatively large harmonics at multiples of Radio Frequency, RF signal input and/or RF signal output frequency of transceivers, demanding filtering in specific locations of the signal chain in the transceivers. Indeed the aforementioned 4-phase signal generator in an I/Q modulator has a harmonic suppression/conversion effect. The fact that the I/Q mixer samples with the quadrature LO signals results in image rejection for each harmonic, however the remaining odd harmonics on the antenna port will reradiate and/or down convert to the baseband. The reason of this is because even in receivers, passive mixers which are bidirectional type of mixer, will back up-convert baseband signals present on the capacitors in the baseband circuits during each LO cycle. In other words, out of band interferers at odd harmonics of the LO signals will be down converted to baseband. Odd harmonics reradiate as well from antenna in receivers after back up-conversion and radiate in transmitters after conversion. Hence suppression of the out of band interferers and suppression of direct radiation of odd harmonics by filtering or HRM will be essential for transceivers performance. However, substantial cost saving could be achieved by removal or reducing the filter's performance. In wideband systems the issue is more important to tackle. This is because e.g. in a wideband low noise amplifier, LNA in the receiver, interferers will be amplified with lower selectivity in the signal chain. It is thus important to suppress the $3^{rd}$ and higher order harmonics.

The HRM based transceivers address bandwidth, selectivity and filtering in the emerging wireless communication systems. Nowadays, almost all HRM based transceivers use I/Q based type of modulators for purpose of image rejection and bandwidth efficiency.

Among the different orders of the harmonics, the $3^{rd}$ and $5^{th}$ order harmonics are critical to supress. Harmonic rejection mixers up to $5^{th}$ order may be realized as 8-phase mixers driven by 8 phase signals for suppression of $3^{rd}$ and $5^{th}$ harmonics.

In addition to the applications mentioned above, where 4-phase signals and 8-phase signals are suitable for the I/Q mixers and 8-phase HRMs in the transceivers, higher order poly-phase signals, e.g. 16-phase, 32-phase etc., or higher order frequency dividers, e.g. divide-by-2, divide-by-4 etc., may be applicable in higher order HRM transceivers or for other applications in other electronic devices, e.g. oscillator scopes, measurement instruments etc.

SUMMARY

A first objective of the embodiments herein is to provide a dynamic latch circuit with low power consumption, a simplified circuit topology and high speed.

According to a first aspect of the embodiments herein, this objective is achieved by an electronic latch circuit. The electronic latch circuit comprises an output circuit which comprising a first output and a second output. The electronic latch circuit further comprises an input circuit which comprising a first input, a second input and a clock signal input.

The input circuit comprises:

a first Metal Oxide Semiconductor, MOS, transistor with a gate connected to the first input, a source connected to a first voltage potential and a drain connected to a first node of the output circuit;

a second MOS transistor with a gate connected to the second input, a source connected to the first voltage potential and a drain connected to a second node of the output circuit; and a third MOS transistor with a gate connected to the clock signal input, a source connected to a second voltage potential, and a drain connected to a third node of the output circuit.

The output circuit comprises:

a fourth MOS transistor with a drain connected to the first node, a gate connected to the second node, and a source connected to the third node;

a fifth MOS transistor with a drain connected to the second node, a gate connected to the first node, and a source connected to the third node.

Further, the first output is connected to the first node, the second output is connected to the second node. And the electronic latch circuit is configured to change state based on input signals at the inputs of the input circuit and a present state of the output circuit.

A second objective of the embodiments herein is to provide a poly-phase signal generator, with improved performance in term of low power consumption.

According to one aspect of the embodiments herein, this objective is achieved by a poly-phase signal generator for generating N phase signals with individual phases.

The poly-phase signal generator comprises a multi-stage frequency divider. The multi-stage frequency divider comprises a first stage which comprising a 4-phase signal generator. The 4-phase signal generator comprises two electronic latch circuits as described above.

The multi-stage frequency divider further comprises a plurality N of cascaded stages, each stage comprises $2^{N-1}$ branches, wherein N=2, 3, .... Each branch comprises an electronic latch circuit and a first 4-phase signal generator as described above. In each branch, the first and second inputs of the electronic latch circuit is connected to a pair of the output signals at the outputs of the 4-phase signal generator in the stage preceding it; the first and second outputs of the electronic latch circuit is connected to the first and second clock signal inputs of the first 4-phase signal generator in the same branch; and the clock signal input of the electronic latch circuit is connected to the first or second clock signal input of the 4-phase signal generator in the stage preceding it.

The poly-phase signal generator further comprises a plurality of $2^{N+1}$ output logic circuits and is configured to generate the plurality of $2^{N+1}$ phase signals at the outputs of each output logic circuit by gating output signals from the outputs of each 4-phase generator in the $N^{th}$ stage, wherein N=2, 3, 4, 5, ....

The electronic latch circuit according to the embodiments herein has some features. The electronic latch circuit comprises 5 MOS transistors, and has a small total active device periphery therefore it is compact and power efficient. Moreover it is fast and operates well at high frequencies due to the lower parasitic associated to the circuit implementation. Since the electronic latch circuit is configured to change state based on all three input signals to the input circuit and the present state of the output circuit, the states are stable, and there is less possibility of overriding the stored state in the circuit. Moreover, there is not any direct current path from the first voltage potential to the second voltage potential under any time and any signal events.

As a result of the mentioned advantages of the electronic latch circuit, the poly-phase signal generators and multi-stage frequency dividers built by the electronic latch circuit are also compact, power efficient and able to operate at high frequencies. Moreover, the structure of the poly-phase signal generator and multi-stage frequency divider are generic to higher order and capable of performing both division and generation of phases. Further, the jitter noise of the circuit is more related to voltage over the active devices than transistors' idle current, as a result the electronic latch circuit preferably operates in current starved mode in which the current in the active devices are controlled by the clock signal input.

Thus, the embodiments herein provide an electronic latch circuit with high speed which is power efficient. Due to the good performance of the electronic latch circuit, the poly-phase signal generator and the multi-stage frequency divider based on the electronic latch circuit also achieve high speed and high power efficiency.

BRIEF DESCRIPTION OF THE DRAWINGS

Examples of embodiments herein are described in more detail with reference to attached drawings in which.

DETAILED DESCRIPTION

In this disclosure the definition of logical levels should be interpreted as follows:
  A low level should be interpreted as a voltage level indicating a value of 0 or logical low.
  A high level should be interpreted as a voltage level indicating a value of 1 or logical high.

In the following description, different aspects will be described in more detail with references to certain embodiments and to accompanying drawings. For purposes of explanation and not limitation, specific details are set forth, such as particular scenarios and techniques, in order to provide a thorough understanding of the different embodiments. However, other embodiments that depart from these specific details may also exist.

Figure 1:
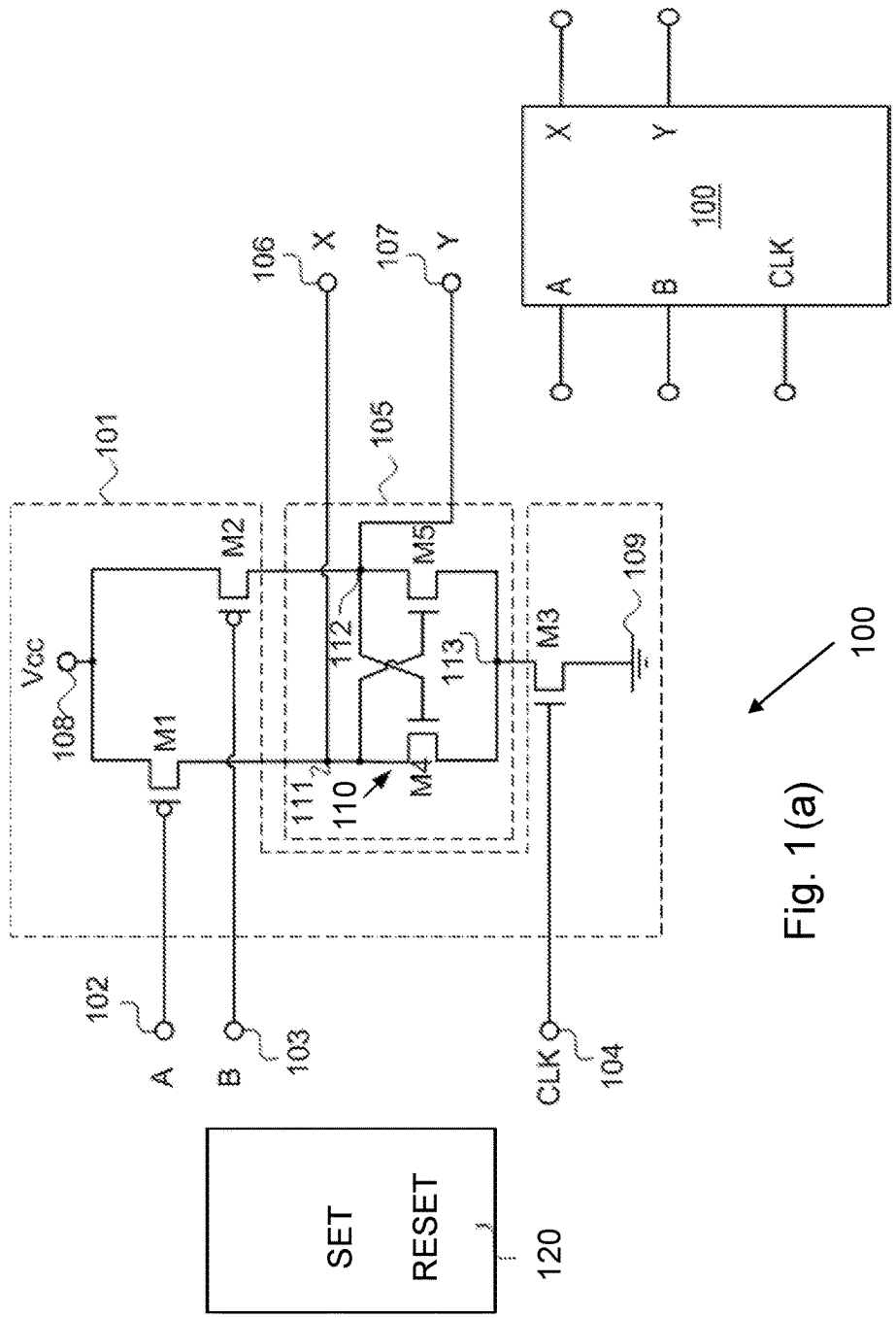
FIG. 1 (a) is a circuit schematic illustrating an electronic latch circuit according to the embodiments herein and (b) is a symbol of the electronic latch circuit.

FIG. 1 (a) is a circuit diagram of an electronic latch circuit, generally designated 100, according to one embodiment. The electronic latch circuit 100 comprises an input circuit 101 and an output circuit 105.

The input circuit 101 comprises an input A, 102 and an input B, 103 for receiving signals comprising low levels or high levels from connectable external circuits. The input circuit 101 further comprises a clock signal input CLK, 104 configured to receive a dock signal from an external clock circuit. The clock signal provides alternating levels between the low and the high at a predetermined frequency and duration.

The input circuit 101 further comprises a first Metal Oxide Semiconductor, MOS transistor M1 with the gate connected to the input A, 102 and a second MOS transistor M2 with the gate connected to the input B, 103. The source of the first MOS transistor M1 and the source of the second MOS transistor M2 are connected to a first voltage potential, e.g. the supply voltage VCC, 108. Moreover, the drain of the first MOS transistor M1 is connected to a first node 111 of the output circuit 105, and the drain of the second MOS transistor M2 is connected to a second node 112 of the output circuit 105.

In this embodiment, the first and the second MOS transistors M1, M2 may be PMOS transistors.

The input circuit 101 further comprise a third MOS transistor M3 with the gate connected to the clock signal input CLK, 104 the source connected to a second voltage potential 109, and the drain connected to a third node 113 of the output circuit 105.

The second voltage potential 109 may in one embodiment be a ground potential. The second voltage potential 109 may in another embodiment be a potential lower than the first voltage potential 108, i.e. the supply voltage VCC.

The output circuit 105 may comprise a regenerative device 110 connected to the first node 111 and to the output X 106, the regenerative device is further connected to the second node 112 and to the output Y 107. The output circuit further comprises a third node 113 connected to the input circuit 101.

The regenerative device 110 comprise a fourth MOS transistor M4 with the drain connected to the first node 111, the gate connected to the second node 112, and the source connected to the third node 113. The regenerative device further comprises a fifth MOS transistor M5 with the drain connected to the second node 112, the gate connected to the first node 111, and the source connected to the third node 113. The third MOS transistor M3, the fourth MOS transistor M4, and the fifth MOS transistor M5 may be NMOS transistors.

Further, the first output X, 106 is connected to the first node 111, the second output Y, 107 is connected to the second node 112.

The electronic latch circuit 100 is configured to change state based on the input signals at the inputs A, B and CLK of the input circuit 101 and a present state of the output circuit 105.

The electronic latch circuit 100 may be accompanied by an additional circuit 120 for the purpose of setting or resetting the state of the latch circuit 100. It is assumed that the additional circuit 120 is configured to initiate the latch circuit 100 to a specific predefined state. Further the additional circuit 120 is arranged and controlled globally so that all involved latch circuits in the embodiments herein are to be synchronized to a specific state.

FIG. 1 (*b*) shows the symbol of the electronic latch circuit 100 for simplifying connections of the circuits built with the electronic latch circuit 100.

The function and states of the electronic latch circuit 100 will now be discussed with reference made to FIGS. 2 (*a*) and (*b*) in order to fully disclose the operation of the electronic latch circuit 100 according to FIG. 1.

Figure 2:
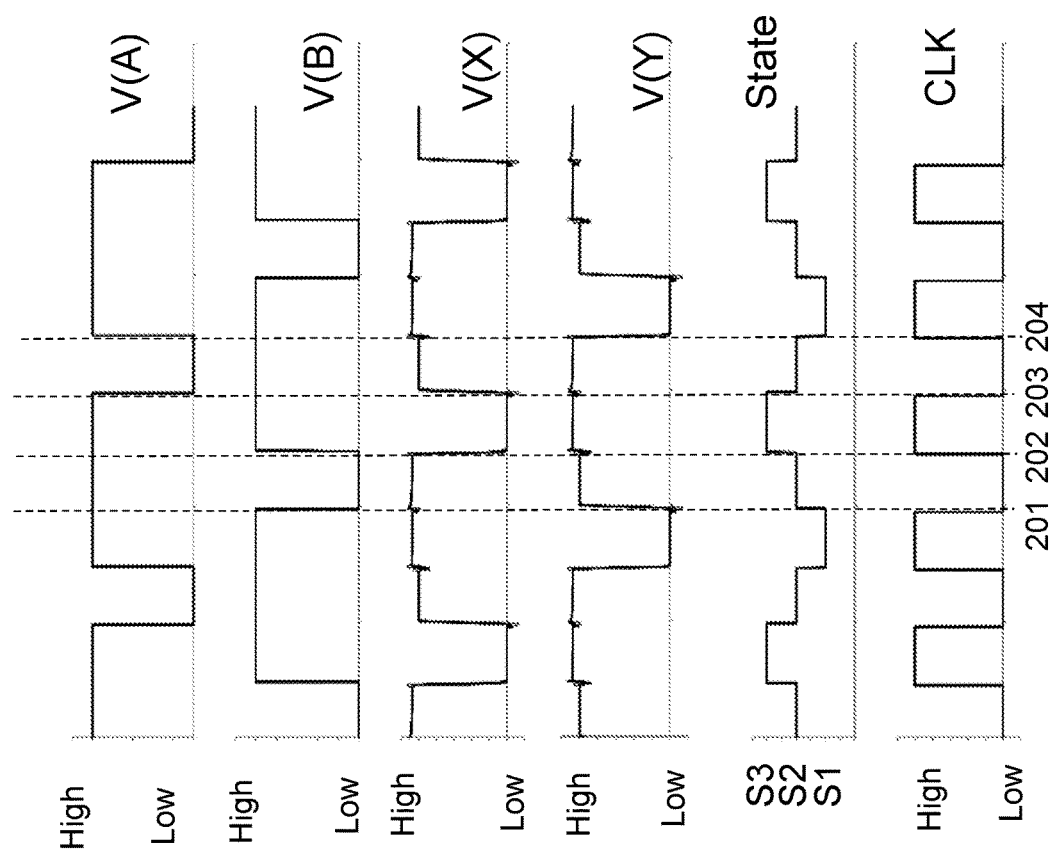
FIG. 2 (a) is a graph illustrating the input and the output signals' time-event of the electronic latch circuit and (b) is a state diagram illustrating different states of the electronic latch circuit according to the embodiments herein.
Figure 2:
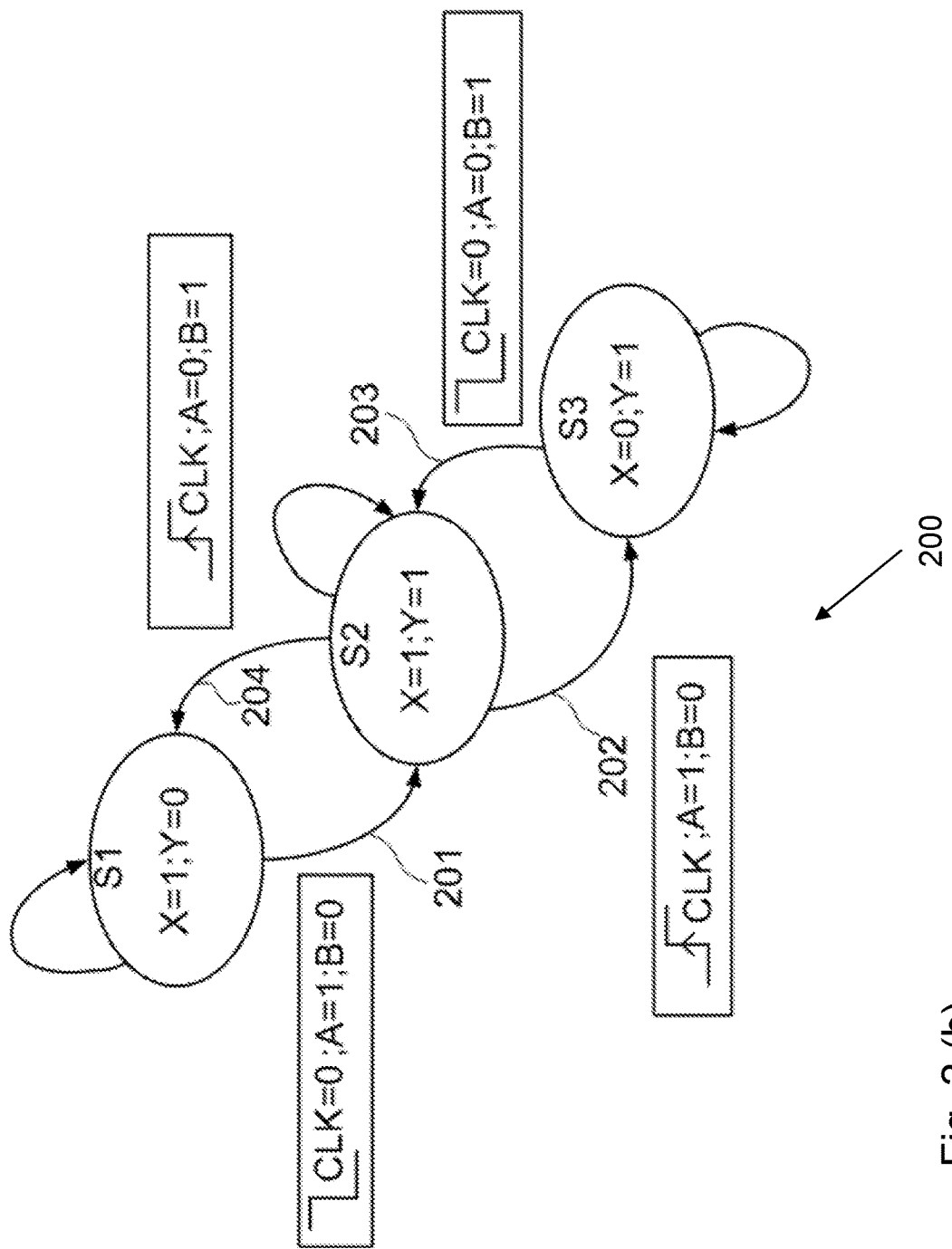

FIG. 2 (*a*) illustrates a Spice simulation of the electronic latch circuit 100. The stimuli to the electronic latch circuit 100 in the Spice simulation consists of a clock signal, illustrated in FIG. 2 (*a*) as CLK connected to the clock signal input 104. Furthermore, the stimuli to the electronic latch circuit 100 consist of two pulse generators connected to input A 102 and input B 103, respectively. The pulse train signals from these two pulse generators are illustrated in FIG. 2(*a*) as V(A) and V(B), respectively. The output X 106 and the output Y 107 from the electronic latch circuit 100, are shown in FIG. 2 (*a*) as V(X) and V(Y). In FIG. 2 (*a*) indicated with State is a signal derived from the outcome of the output X 106 and the output Y 107, this signal indicates a state of the electronic latch circuit 100, i.e. S1, S2 or S3 based on the output X 106 and the output Y 107. These states will later be discussed with reference made to FIG. 2 (*b*). The horizontal axes of FIG. 2 (*a*) are time axes and the corresponding vertical axes indicate voltages between a low voltage indicating a low level and a high voltage indicating a high level.

In order to provide a concise description, it is convenient to introduce a shorthand notation for the signals of the electronic latch circuit 100 as follows.

A=0 means that the input A, 102 is at a low level, indicating a logical 0.

A=1 means that the input A, 102 is at a high level, indicating a logical 1.

Hence, CLK=0 should be interpreted as a low level on the clock signal input 104, indicating a logical 0.

X=1 should be interpreted as a high level on the output X, etc.

A transition from A=0 to A=1 is indicated by A=0|1.

The Boolean operator AND is written as '&'. Thus, A=0 & B=1 indicates a low level on the input A and a high level on input B.

It is possible to define a state machine from the inner workings of the electronic latch circuit 100. A state machine is generally described with a state diagram as shown in FIG. 2 (*b*), designated 200. This state diagram 200 defines three different states for the output circuit 105, of the electronic latch circuit 100, from the group of:

A first state S1, comprising a high level at the output X, a low level at the output Y, i.e. X=1, Y=0;

A second state S2, comprising a high level at the output X and at the output Y, i.e. X=1, Y=1;

A third state S3, comprising a low level at the output X, a high level at the output Y, i.e. X=0, Y=1;

Each of these states is illustrated as ellipses in FIG. 2 (*b*).

The transition from a state to another state is controlled by the input signals to the input circuit 101, i.e. the input signals at A, B and CLK as well as by the present level of the output circuit 105.

In the following, different situations and conditions for changing state in the electronic latch circuit 100 will be described as different scenarios with reference to FIG. 2 (*a*).

Scenario 201: At time t=$t_1$, S1->S2, i.e. (X=1, Y=0)-> (X=1, Y=1), indicated with a dotted vertical line 201 in FIG. 2 (*a*).

The electronic latch circuit 100 changes state from the first state S1 to the second state S2 upon detecting a high level on the input A 102, a low level on the input B 103, a low level on the clock signal input 104, and that the output circuit 105 is in the first state S1, which is denoted as A=1 & CLK=0 & B=0 & State=S1 using the above short-hand notation.

Furthermore, A=1 and B=0, which causes the first MOS transistor M1 to be off, and the second MOS transistor M2 to be on, and CLK=0 which causes the third MOS transistor M3 to be off. This condition pulls up the voltage potential at nodes 112 to the supply voltage VCC, i.e. the logic high.

Scenario 202: At time t=$t_2$, S2->S3, i.e. (X=1, Y=1)->(X=0, Y=1), indicated with a dotted vertical line 202 in FIG. 2 (*a*).

The electronic latch circuit 100 changes from the second state S2 to the third state S3 upon detecting a transition on the clock signal input CLK from a low level to a high level, CLK=0|1 and A=1 & B=0 and the output circuit 105 is in the second state S2, which is denoted as A=1 & CLK=0|1 & B=0 & State=S2.

At the rising edge of the clock signal the regenerative device pair 110 turns on. The levels of the signals A=1 and B=0 increase the probability for the regenerative device 110 to tilt towards pulling down 111, which gives X=0 and accordingly Y=1. Consequently the electronic latch circuit 100 changes state from the second state S2 to the third state S3.

Scenario 203: At time t=$t_3$, S3->S2, (X=0, Y=1)->(X=1, Y=1), indicated with a dotted vertical line 203 in FIG. 2 (*a*).

The electronic latch circuit 100 changes from the third state S3 to the second state S2 upon detecting a high level on the input B 103, a low level on the input A 102, and low level on the clock signal input CLK 104 and that the output circuit 105 is in the third state S3, which is denoted as A=0 & CLK=0 & B=1 & State=S3.

This change of state is initiated upon a falling edge of CLK=1|0, which turns off the third MOS transistor M3. The input A=0 which causes the first MOS transistor M1 turns on, which in turn causes a high level on the first node 111 and on the output X.

Scenario 204: At time t=$t_4$, S2->S1, i.e. (X=1, Y=1)->(X=1, Y=0), indicated with a dotted vertical line 204 in FIG. 2 (*a*).

The electronic latch circuit 100 changes from the second state S2 to the first state S1 upon detecting a transition on the clock signal input CLK 104 from a low level to a high level, a high level on the input B 103, a low level on the input A 102, and the output circuit 105 is in the second state S2. This condition can be expressed as CLK=0|1 & B=1 & A=0 & State =S2 using the mentioned short-hand notation.

At the rising edge of the clock signal the regenerative device pair 110 will turn on. The levels of the signals A=0 and B=1 increase the probability for the regenerative device to tilt towards pulling down 112, Y=0 and hence X=1. Consequently the electronic latch circuit 100 changes state from the second state S2 to the first state S1.

From the above description, it can be seen that pulse signals may be generated at the outputs X, Y with control signals at the inputs A, B, CLK. With these state change scenarios in mind, multi-phase signal generators may be implemented by connecting a plurality of the electronic latch circuit 100 according to the embodiments herein.

Figure 3:
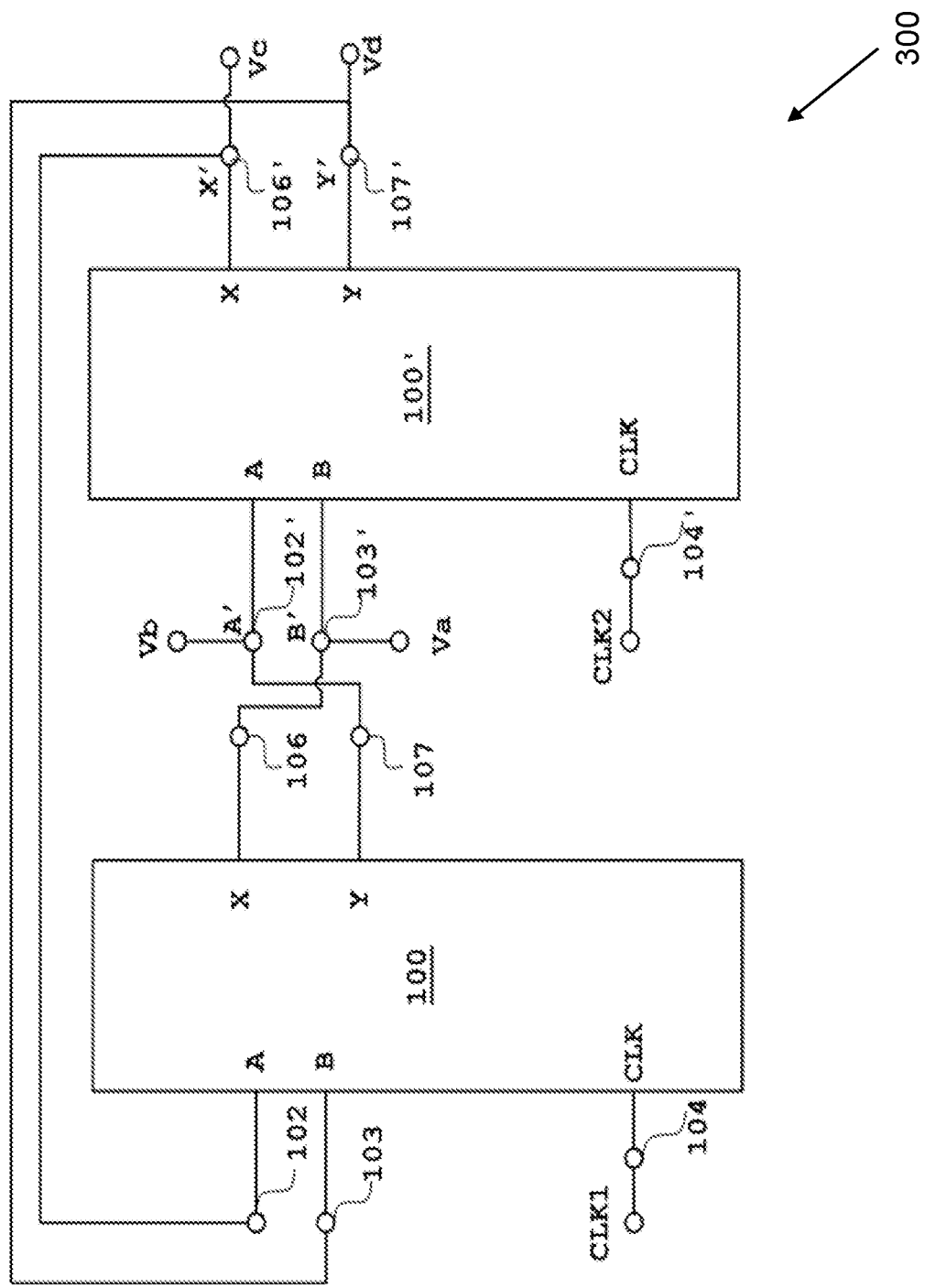
FIG. 3 (a) is a block diagram illustrating a 4-phase signal generator according to the embodiments herein; (b) is a block diagram illustrating another 4-phase signal generator according to the embodiments herein; (c) is a symbol of the 4-phase signal generator (d) is a 4-phase signal generator with a clock generator.
Figure 3:
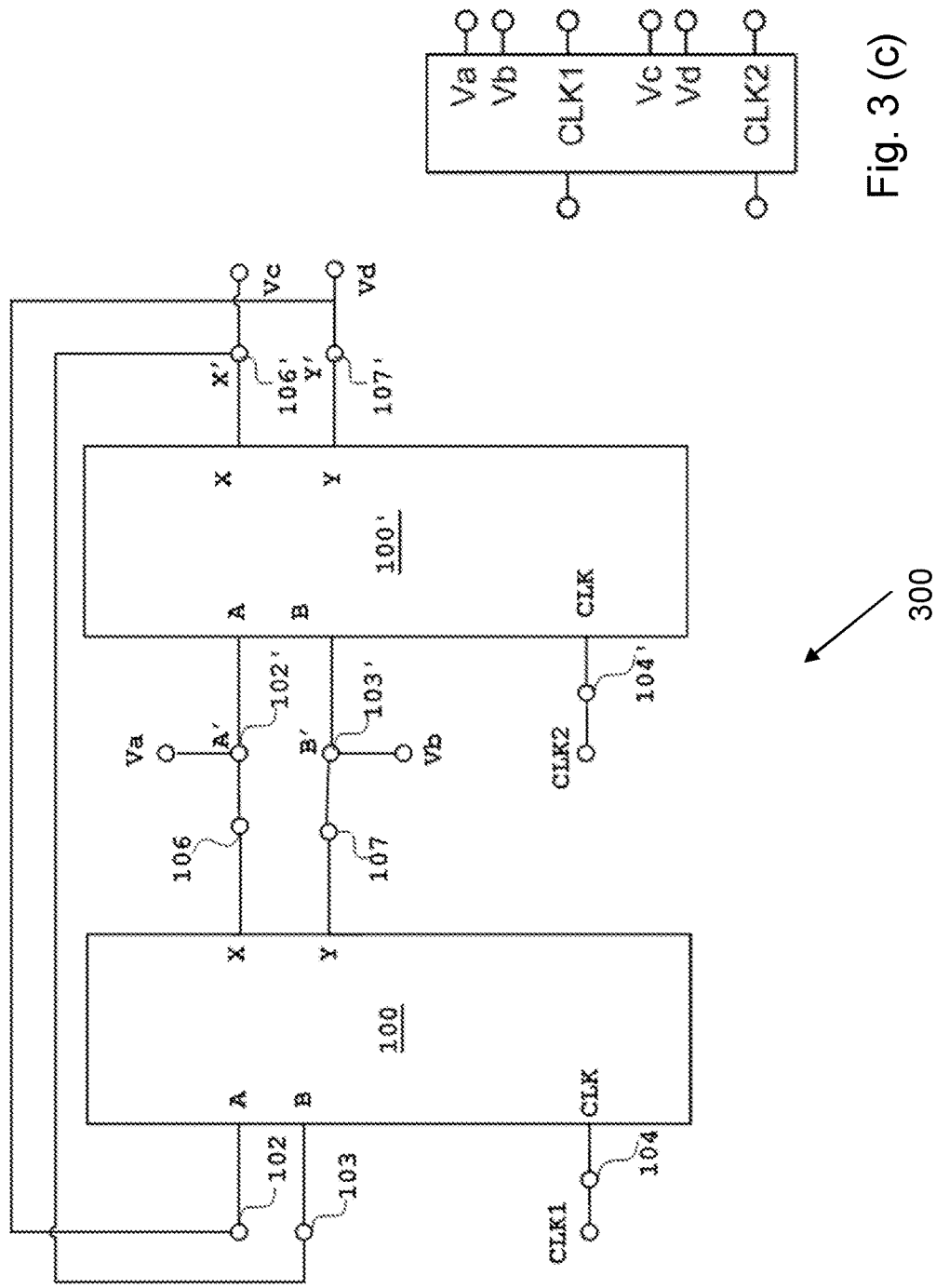
Figure 3:
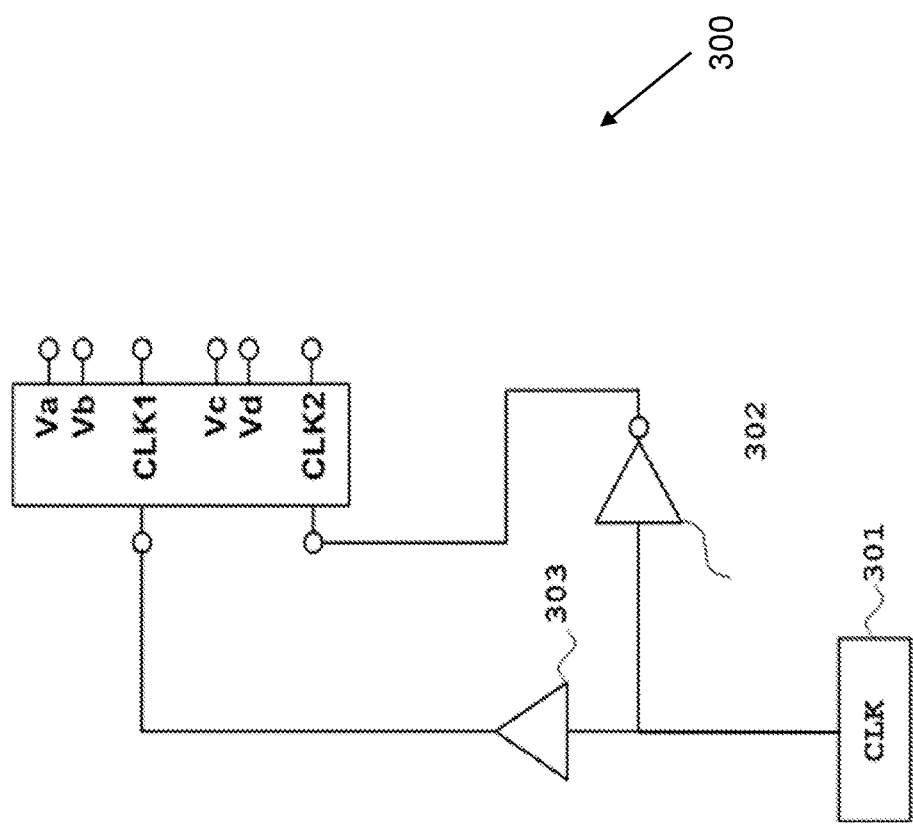

In FIG. 3, one embodiment of a 4-phase generator for generating 4 phase signals with individual phases is depicted and as shown in FIG. 3 (*a*), the 4-phase generator is commonly designated 300. The 4-phase generator 300 comprises a first clock signal input CLK1, a second clock signal input CLK2 and four outputs Va, Vb, Vc and Vd. The 4-phase signal generator 300 further comprises a first and a second electronic latch circuit 100, 100' according to the embodiments of an electronic latch circuit 100. The first and second electronic latch circuit 100 and 100' are connected as in the following description: The first input A, 102 of the first electronic latch circuit 100 is connected to the first output X', 106' of the second electronic latch circuit 100'.

The second input B, 103 of the first electronic latch circuit 100 is connected to the second output Y', 107' of the second electronic latch 100'.

The first input A', 102' of the second electronic latch circuit 100' is connected to the second output Y, 107 of the first electronic latch circuit 100.

The second input B', 103' of the second electronic latch circuit 100' is connected to the first output X, 106 of the first electronic latch 100.

Further, the first clock signal input CLK1 is connected to the clock signal input 104 of the first electronic latch circuit 100; and the second clock signal input CLK2 is connected to the clock signal input 104' of the second electronic latch circuit 100'.

The first output Va is connected to the first output X, 106 of the first electronic latch circuit 100.

The second output Vb is connected to the second output Y, 107 of the first electronic latch circuit 100.

The third output Vc is connected to the first output X', 106' of the second electronic latch circuit 100'.

The fourth output Vd is connected to the second output Y', 107' of the second electronic latch circuit 100'.

Another embodiment of the 4-phase generator may be obtained by modifying the first embodiment of the 4-phase generator disclosed above and shown in FIG. 3 (*a*). This modification consists of connecting the input A' to the output X, the input B' to the output Y, the output X' to the input B, and output Y' to the input A, as shown in FIG. 3 (*b*). The primed inputs and outputs belongs to the second electronic latch circuit 100', and the unprimed inputs and outputs belongs to the first electronic latch circuit 100.

FIG. 3(*c*) shows a symbol of the 4-phase generator 300 according to the embodiments shown in FIGS. 3 (*a*) and (*b*), wherein the clock signal inputs CLK1 and CLK2 are shown on both sides of the block, this is just for simplifying connections of circuits built with the 4-phase generator 300.

In order to generate 4 phase signals with individual phases, the 4-phase signal generator is configured to receive a first clock signal with a frequency of $f_{CLK}$ at the first clock signal input CLK1; and receive a second clock signal which is an inverse signal of the first clock signal at the second clock signal input CLK2. This may be implemented, as shown in FIG. 3 (*d*), by connecting a clock generator 301 via a transmission gate 303 to the first clock signal input CLK1. The dock generator 301 is further connected to the second clock signal input CLK2 via an inverter 302.

The transmission gate 303 and the inverter 302 may be configured to introduce a delay of the same length to the dock signal. This causes the outputs from the inverter and the transmission gate to be 180 degrees out of phase.

However, the second clock signal CLK2, i.e. the clock signal input 104' of the second electronic latch circuit 100', may of course also be directly connected to a second clock generator configured to generate a clock signal that is 180 degrees out of phase with respect to the clock generator 301. In this case the transmission gate 303 is unnecessary.

The 4-phase generator 300 provides a first phase signal Va at the output X of the first electronic latch circuit 100, a second phase signal Vb at the output Y of the first electronic latch circuit 100, a third phase signal Vc is provided at the output X' of the second electronic latch circuit 100', and a fourth phase signal Vd is provided at the output Y of the second electronic latch circuit 100'.

The 4 phase signals are generated at the four outputs Va, Vb, Vc and Vd with a frequency of $f_{CLK}/2$, wherein the first and second phase signals at the first and second outputs Va and Vb are a pair of signals with 180 degree phase difference, and the third and fourth phase signals at the third and fourth outputs Vc and Vd are a pair of signals with 180 degree phase difference.

Figure 4:
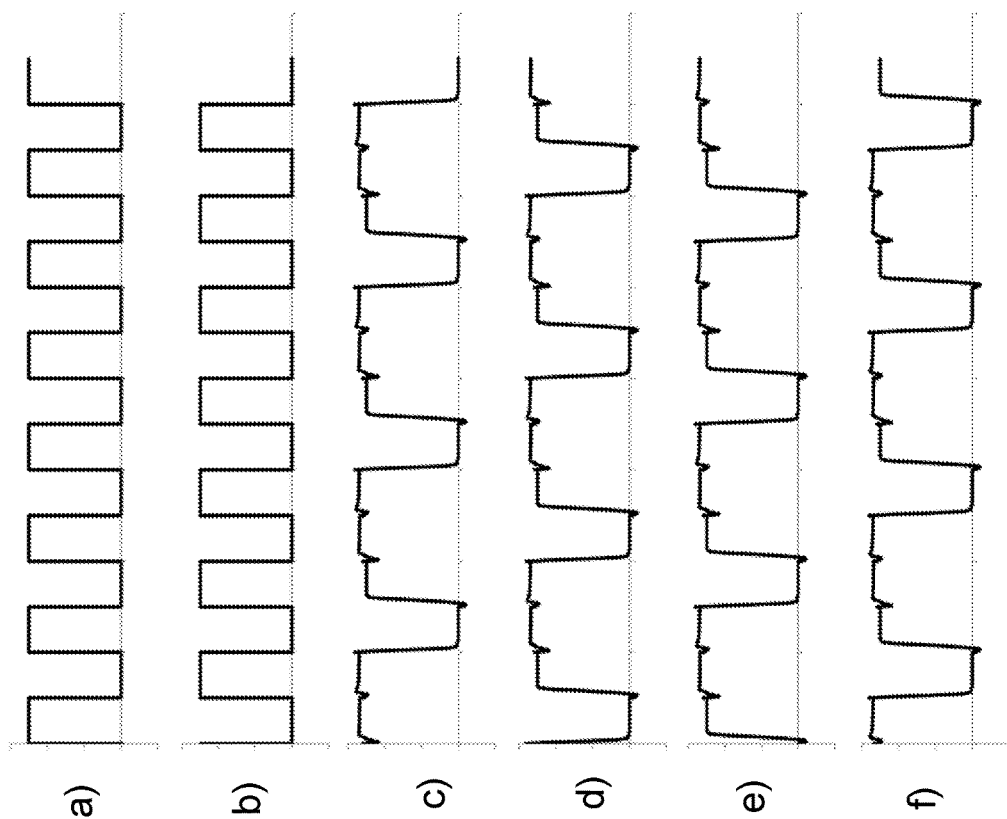
FIG. 4 is a graph illustrating the different signals' time-event of the 4-phase generator shown in FIG. 3.

In FIG. 4 the four phase signals are shown from a SPICE simulation of the embodiment of the 4-phase generator disclosed with reference made to FIG. 3.

FIG. 4a) shows the clock signal applied to the first clock signal input CLK1, i.e. the clock signal input 104 of the first electronic latch circuit 100.

FIG. 4b) shows the clock signal applied to the second clock signal input CLK2, i.e. the clock signal input 104' of the second electronic latch circuit 100'. CLK2 is the inverse of the clock signal applied to the clock signal input 104 of the first electronic latch circuit 100.

FIG. 4c) shows the first phase signal Va.

FIG. 4d) shows the second phase signal Vb.

FIG. 4e) shows the third phase signal Vc.

FIG. 4f) shows the fourth phase signal Vd.

As shown in FIG. 4, the 4 phase signals have a frequency of $f_{CLK}/2$, and the 4-phase signal generator 300 is therefore also a divide-by-2 circuit. Higher order divider may be built by cascading several stages of the 4-phase signal generator 300.

Figure 5:
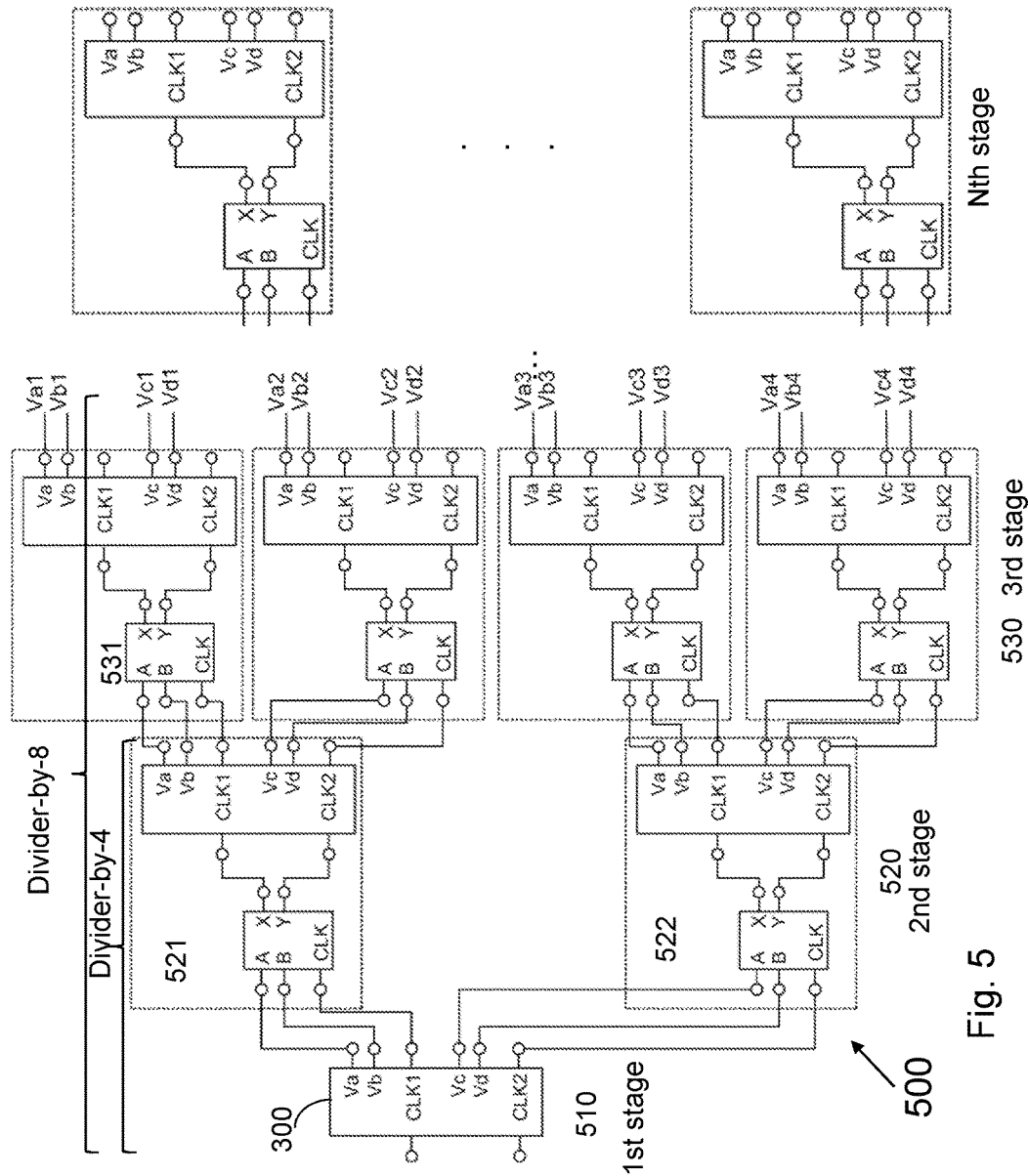
FIG. 5 is a block diagram illustrating a multi-stage frequency divider according to the embodiments herein.

According to some embodiments herein, a multi-stage frequency divider 500 is built with the electronic latch circuit 100 and the 4-phase signal generator 300, as shown in FIG. 5.

The multi-stage frequency divider 500 comprises a $1^{st}$ stage 510 comprising the 4-phase signal generator 300.

Moreover the multi-stage frequency divider 500 comprises a plurality N of cascaded stages 520, 530, . . . each stage comprises $2^{N-1}$ branches 521, 522, 531, . . . wherein the stage N=2, 3, . . . .

Each branch 521, 522, 531, . . . comprises an electronic latch circuit 100 and a first 4-phase signal generator 300.

In each branch, the first and second inputs A, B of the electronic latch circuit 100 are connected to a pair of the 180 degree out-of-phase signals, Va and Vb or Vc and Vd, at the four outputs of the 4-phase signal generator in the stage preceding it.

For example, the first and second inputs A and B of the electronic latch circuit 100 in the branch 521 are connected to the first and second outputs Va and Vb of the 4-phase signal generator in the $1^{st}$ stage 510. The first and second inputs A and B of the electronic latch circuit 100 in the branch 522 are connected to the third and fourth outputs Vc and Vd of the 4-phase signal generator in the $1^{st}$ stage 510. The first and second inputs A and B of the electronic latch circuit 100 in the branch 531 are connected to the first and second outputs Va and Vb of the first 4-phase signal generator in branch 521 in the $2^{nd}$ stage 520.

Further, in each branch, the first and second outputs X and Y of the electronic latch circuit 100 are connected to the first and second clock signal inputs CLK1, CLK2 of the first 4-phase signal generator in the same branch; and the clock signal input of the electronic latch circuit 100 is connected to the first or second clock signal input CLK1, CLK2 of the 4-phase signal generator in the stage preceding it.

For example, in the branch 521, the first and second outputs X and Y of the electronic latch circuit 100 are connected to the first and second clock signal inputs CLK1 and CLK2 of the first 4-phase signal generator in the branch 521, and the clock signal input of the electronic latch circuit 100 is connected to the first clock signal input CLK1 of the 4-phase signal generator in the $1^{st}$ stage 510. In the branch 522, the first and second outputs X and Y of the electronic latch circuit 100 are connected to the first and second clock signal inputs CLK1 and CLK2 of the first 4-phase signal generator in the branch 522, and the clock signal input of the electronic latch circuit 100 is connected to the second clock signal input CLK2 of the 4-phase signal generator in the $1^{st}$ stage 510. In the branch 531, the first and second outputs X and Y of the electronic latch circuit 100 are connected to the first and second clock signal inputs CLK1, CLK2 of the first 4-phase signal generator in the branch 531, and the clock signal input of the electronic latch circuit 100 is connected to the first clock signal input CLK1 of the first 4-phase signal generator in branch 521 of the $2^{nd}$ stage 520.

The multi-stage frequency divider 500 is further configured to receive a first clock signal with a frequency of $f_{CLK}$ at the first clock signal input CLK1 of the 4-phase generator in the $1^{st}$ stage 510; receive a second clock signal which is an inverse of the first clock signal at the second clock signal input CLK2 of the 4-phase generator in the $1^{st}$ stage 510; and generate output signals at the $N^{th}$ stage with a frequency of $f_{CLK}/(2^N)$ at the four outputs Va, Vb, Vc and Vd of each 4-phase generator in the $N^{th}$ stage, wherein N=2, 3, . . . .

For example, when N=2, the multi-stage frequency divider 500 only comprises two stages 510, 520. After the $1^{st}$ stage, the output signals have a frequency of $f_{CLK}/2$, and after the $2^{nd}$ stage 520, the output signals have a frequency of $f_{CLK}/(2^2)=f_{CLK}/4$. So the multi-stage frequency divider 500 in this case is a divide-by-4 circuit.

When N=3, the multi-stage frequency divider 500 comprises three stages 510, 520, 530. After the $1^{st}$ stage, the output signals have a frequency of $f_{CLK}/2$, after the $2^{nd}$ stage 520, the output signals have a frequency of $f_{CLK}/4$, and after the $3^{rd}$ stage, the output signals have a frequency of $f_{CLK}/(2^3)=f_{CLK}/8$. So the multi-stage frequency divider 500 in this case is a divide-by-8 circuit.

Figure 6:
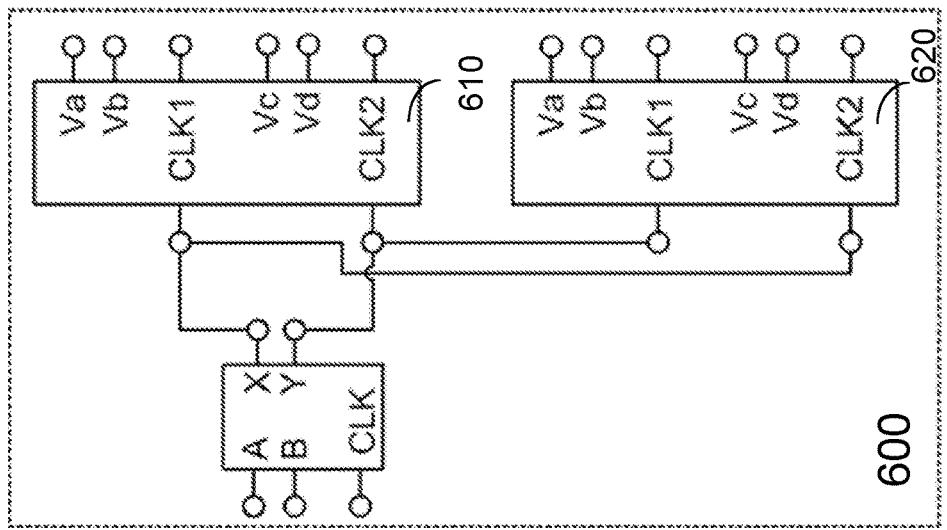
FIG. 6 is a block diagram illustrating one branch in a multi-stage frequency divider according to the embodiments herein.

According to some embodiments, each branch 521, 522, 531, . . . in any one of the stages may further comprise a second 4-phase signal generator 300, as shown in FIG. 6, denoted as branch 600. In branch 600, the first and second dock signal inputs CLK1 and CLK2 of the second 4-phase signal generator 620 are respectively connected to the second and first clock signal inputs CLK2 and CLK1 of the first 4-phase signal generator 610 such that the clock signals of the first and the second 4-phase signal generator have inverse polarity with respect to each other.

Figure 7:
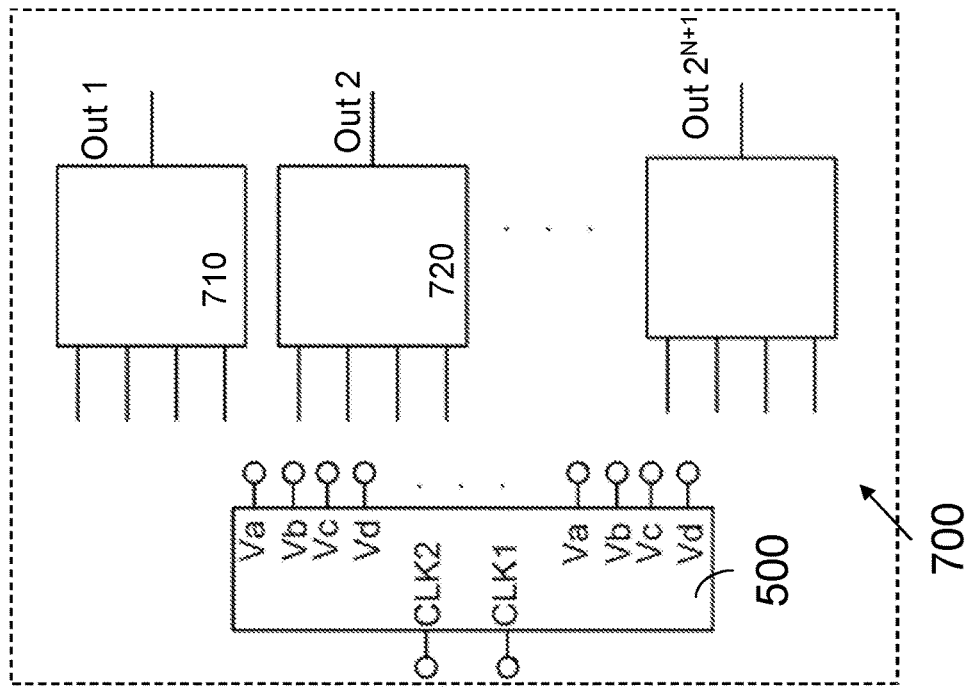
FIG. 7 is a block diagram illustrating a poly-phase signal generator according to the embodiments herein.

For generating multiple phase signals, a poly-phase signal generator 700 for generating a plurality of $2^{N+1}$ phase signals with individual phases may be built with the multi-stage frequency divider 500 according to the embodiments herein, as shown in FIG. 7. In which N=1, 2, . . . is the number of stages in the poly-phase generator.

The poly-phase signal generator 700 comprises a multi-stage frequency divider 500 and a plurality of $2^{N+1}$ output logic circuits 710, 720 . . . .

The poly-phase signal generator 700 is configured to generate the plurality of $2^{N+1}$ phase signals at the outputs Out 1, Out 2, . . . Out $2^{N+1}$ of each output logic circuit, by gating output signals from the outputs Va, Vb, Vc and Vd of each 4-phase generator in the N stage.

Figure 8:
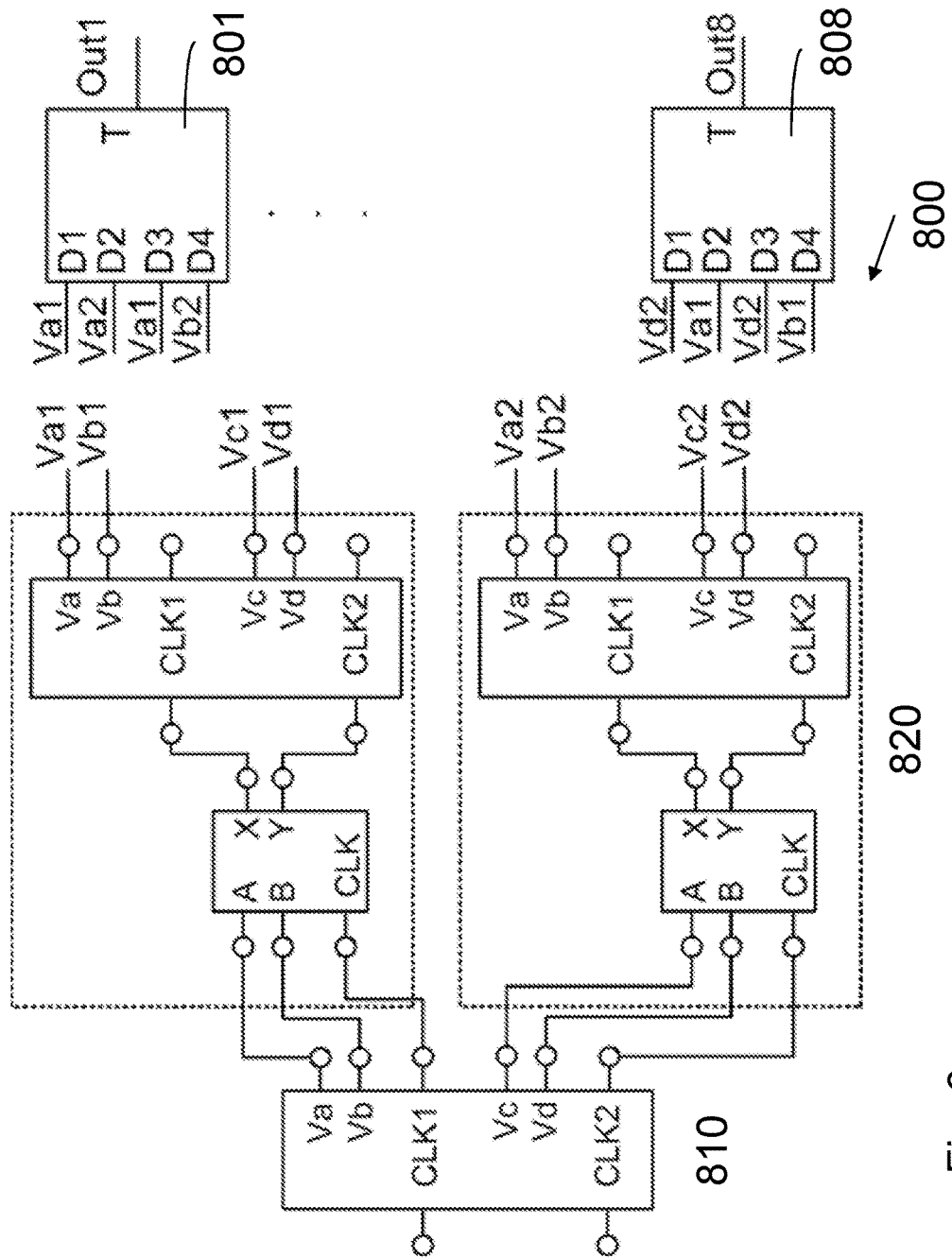
FIG. 8 is a block diagram illustrating an 8-phase signal generator according to the embodiments herein.

One example of an 8-phase signal generator for generating 8 phase signals with individual phases is shown in FIG. 8.

The 8-phase signal generator 800 comprises a multi-stage frequency divider 500 with two stages 810, 820, i.e. N=2.

The 8-phase signal generator 800 further comprises 8 output logic circuits 801, . . . , 808 and the 8-phase signal generator 800 is configured to generate 8 output signals Va1, Va2, Vc1, Vc2, Vb1, Vb2, Vd1 and Vd2 with a frequency of $f_{CLK}/4$ at the eight outputs of the 4-phase generators in the 2nd stage, 820.

Figure 9:
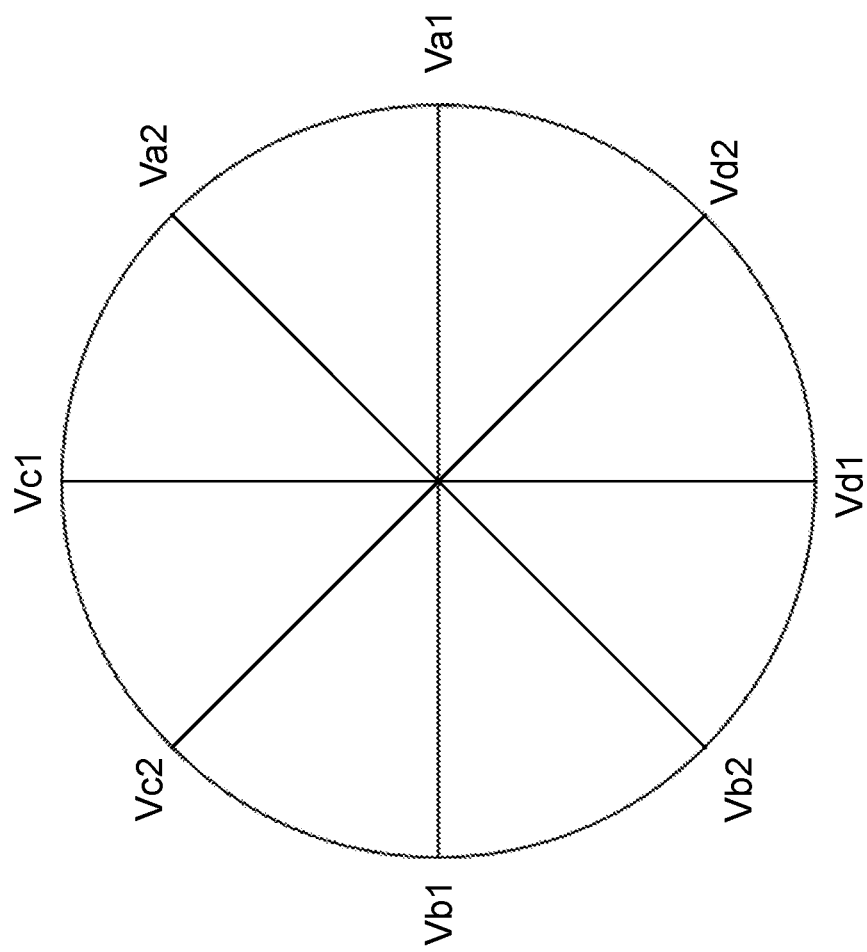
FIG. 9 is a graph illustrating phase relations of the output signals from the 8-phase signal generator according to the embodiments herein shown in FIG. 8.

FIG. 9 shows phase relations of the output signals from the 4-phase generators in the 2nd stage 820. As shown in FIG. 9, the 8 output signals Va1, Va2, Vc1, Vc2, Vb1, Vb2, Vd1 and Vd2 are adjacent to each other with 45 degree relative phase shift.

The 8-phase signal generator 800 is further configured to generate the 8 phase signals Out1, . . . Out8, at the outputs of each output logic circuit by gating one output signal with its adjacent output signal and with the signal which has 180 degree phase difference to the adjacent output signal.

For example, the first phase signal is generated at the output of the first output logic circuit 801 by gating the first output signal Va1 with the second output signal Va2 and gating the first output signal Va1 with the signal Vb2 which has 180 degree phase difference to the second output signal Va2. The gating operations may be expressed by:

$$Out_1 = \overline{(Va1+Va2)} \cdot \overline{(Va1+Vb2)}$$

The second phase signal is generated at the output of the second output logic circuit 802 by gating the second output signal Va2 with the third output signal Vc1 and gating the second output signal Va2 with the signal Vd1 which has 180 degree phase difference to the third output signal Vc1. The gating operations may be expressed by:

$$Out_2 = \overline{(Va2+Vc1)} \cdot \overline{(Va2+Vd1)}$$

The gating operation is applied to the rest of the output signals to generate other phases signals, expressed by:

$$Out_3 = \overline{(Vc1+Vc2)} \cdot \overline{(Vc1+Vd2)}$$

$$Out_4 = \overline{(Vc2+Vb1)} \cdot \overline{(Vc2+Va1)}$$

$$Out_5 = \overline{(Vb1+Vb2)} \cdot \overline{(Vb1+Va2)}$$

$$Out_6 = \overline{(Vb2+Vd1)} \cdot \overline{(Vb2+Vc1)}$$

$$Out_7 = \overline{(Vd1+Vd2)} \cdot \overline{(Vd1+Vc2)}$$

$$Out_8 = \overline{(Vd2+Va1)} \cdot \overline{(Vd2+Vb1)}$$

Figure 10:
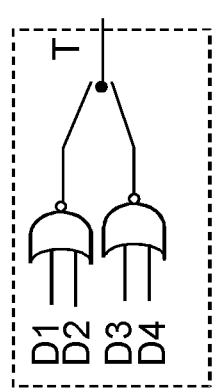
FIGS. 10 (a) and (b) are block diagrams illustrating the output logic circuits in the 8-phase signal generator shown in FIG. 8.
Figure 10B:
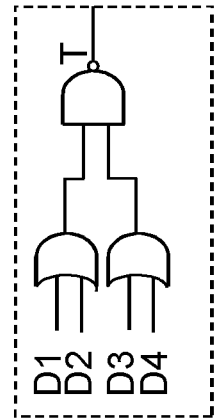

FIG. 10 shows two implementation examples of the output logic circuits 801, . . . 808. In FIG. 10 (a), the output logic circuit comprises 2 NOR gates with 3-state at the outputs of each NOR gate so that only one NOR gate contributes to the output signal of the output logic circuit, i.e. the one with outcome of a logic high and the other NOR gate's output which is logic low will be ignored. This can be expressed as T has value of 1 for either T=$\overline{(D1+D2)}$, or T=$\overline{(D3+D4)}$. In FIG. 10 (b), the output logic circuit comprises 2 OR gates and 1 NAND gate, which has the function of T=$\overline{(D1+D2) \cdot (D3+D4)}$.

Figure 11:
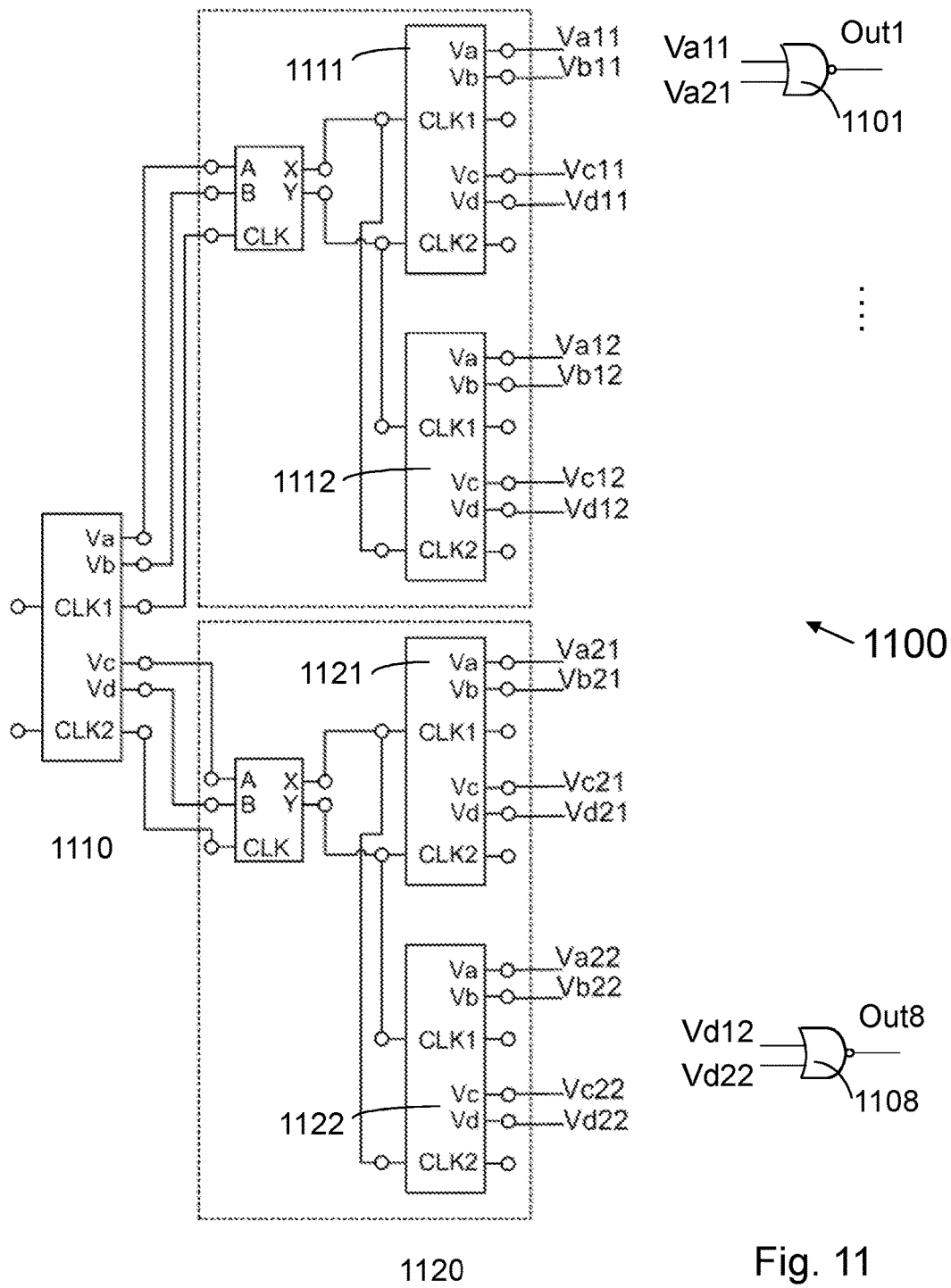
FIG. 11 is a block diagram illustrating another 8-phase signal generator according to the embodiments herein.

FIG. 11 shows another embodiment of an 8-phase signal generator for generating 8 phase signals with individual phases. In this embodiment, the 8-phase signal generator 1100 comprises 2 stages 1110 and 1120. The $2^{nd}$ stage 1120 comprises 2 branches and each branch comprises two 4-phase signal generators 1111, 1112, 1121 and 1122.

The 8-phase signal generator 1100 further comprises 8 output logic circuits 1101, 1102, . . . and 1108, each output logic circuit comprises a NOR gate.

The 8-phase signal generator 1100 is configured to generate 16 output signals with a frequency of $f_{CLK}/4$ at the outputs of the 4-phase generators 1111, 1112, 1121 and 1122 in the $2^{nd}$ stage, and the 16 output signals are adjacent to each other with 45 degree relative phase difference in the following sequence Va11-Va21, Va12-Va22, Vb11-Vb21, Vb12-Vb22, Vc11-Vc21, Vc12-Vc22, Vd11-Vd21, Vd12-Vd22.

The 8 phase signals are generated at the output of each output logic circuit by NOR gating the four outputs from the first 4-phase signal generators 1111 and 1121 in each branch, such as:

$$Out_1 = Va11 \text{ NOR } Va21$$

$$Out_2 = Vb11 \text{ NOR } Vb21$$

$$Out_3 = Vc11 \text{ NOR } Vc21$$

$$Out_4 = Vd11 \text{ NOR } Vd21$$

And NOR gating the four outputs from the second 4-phase signal generators 1112, 1122 in each branch, such as:

$$Out_5 = Va12 \text{ NOR } Va22$$

$$Out_6 = Vb12 \text{ NOR } Vb22$$

$$Out_7 = Vc12 \text{ NOR } Vc22$$

$$Out_8 = Vd12 \text{ NOR } Vd22$$

Figure 12:
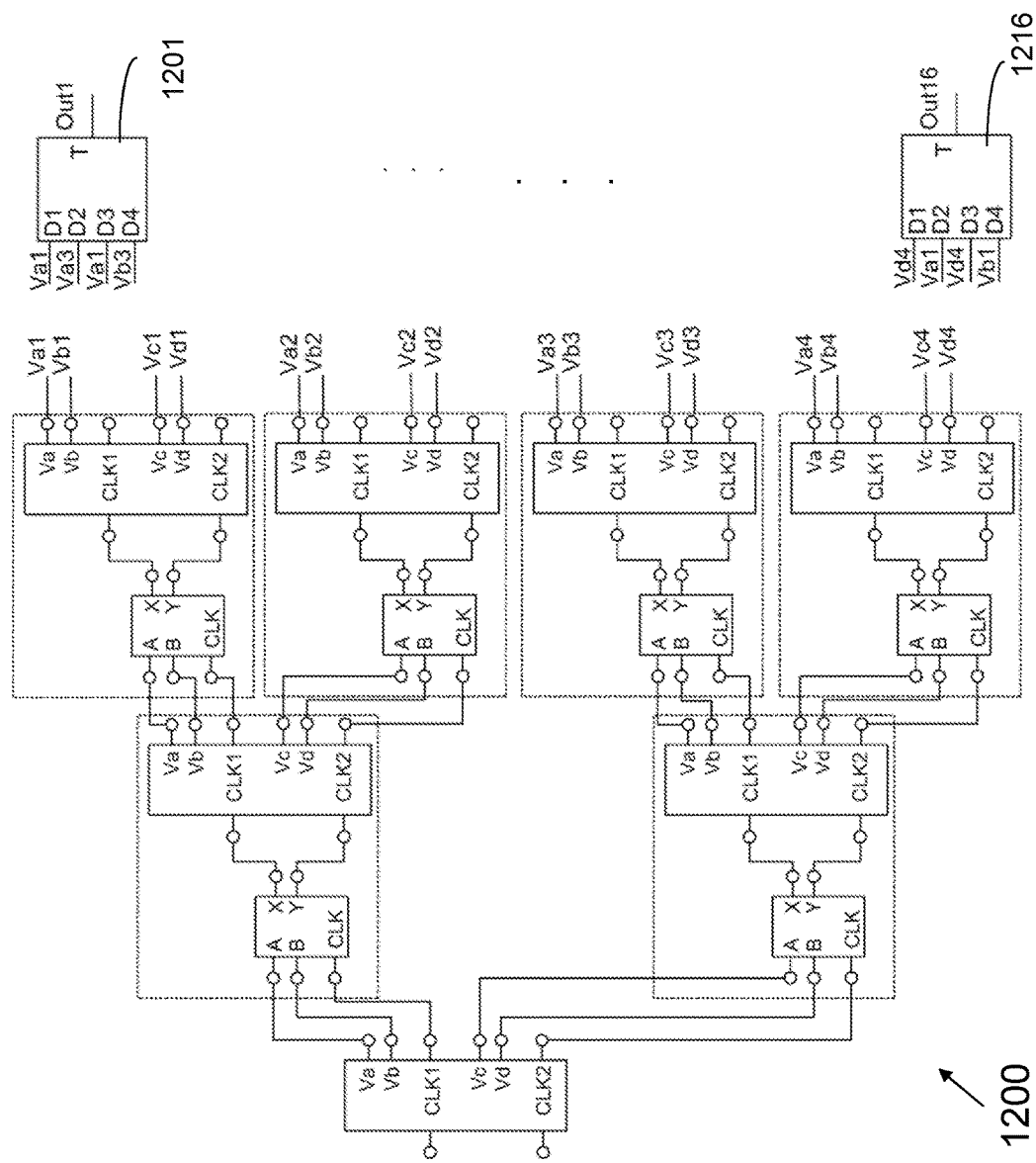
FIG. 12 is a block diagram illustrating a 16-phase signal generator according to the embodiments herein.

FIG. 12 shows one embodiment of a 16-phase signal generator 1200 for generating 16 phase signals with individual phases.

The 16-phase signal generator 1200 comprises a multistage frequency divider 500, wherein N=3, so that the 16-phase signal generator 1200 comprises 3 stages, the $2^{nd}$ stage comprises 2 branches and the $3^{rd}$ stage comprises 4 branches.

The 16-phase signal generator 1200 further comprises 16 output logic circuits 1201, . . . and 1216.

The 16-phase signal generator 1200 is configured to generate 16 output signals with a frequency of $f_{CLK}/8$ at the outputs of the 4-phase generators in the $3^{rd}$ stage.

Figure 13:
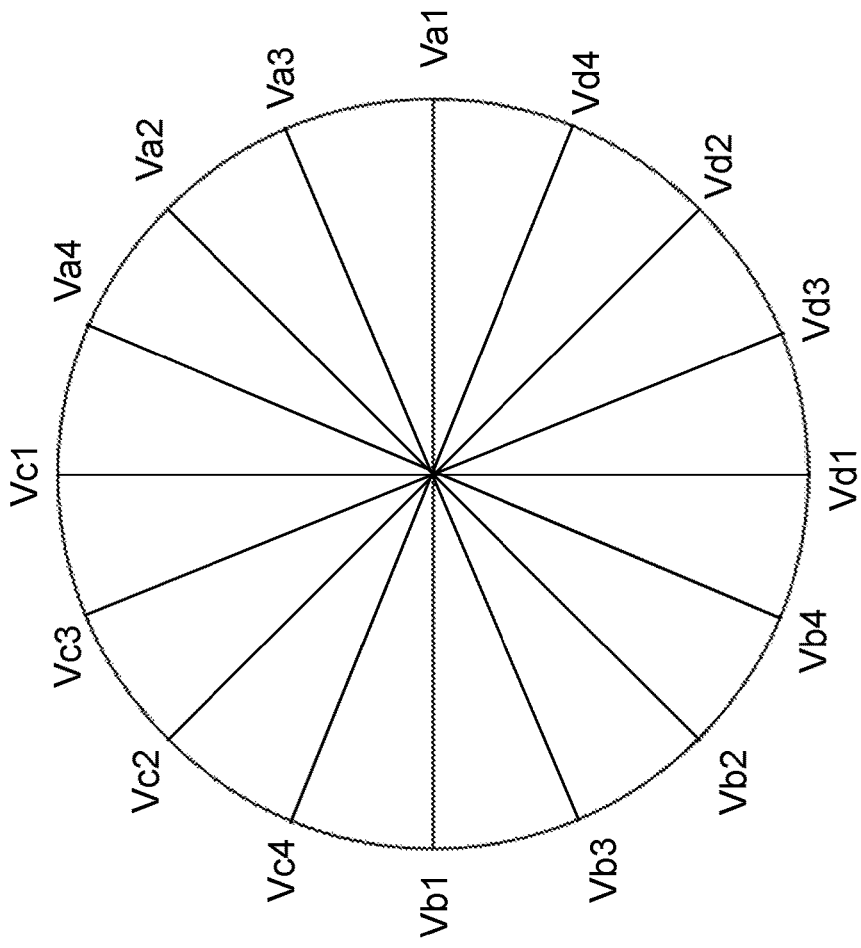
FIG. 13 is a graph illustrating phase relations of the output signals from the 16-phase signal generator according to the embodiments herein shown in FIG. 12.

FIG. 13 shows the relative phase relations of the output signals from the 4-phase generators in the $3^{rd}$ stage. As shown in FIG. 13, the 16 output signals are adjacent to each other with 22.5 degree phase shift in the following sequence Va1-Va3, Va3-Va2, Va2-Va4, Va4-Vc1, Vc1-Vc3, Vc3-Vc2, Vc2-Vc4, Vc4-Vb1, Vb1-Vb3, Vb3-Vb2, Vb2-Vb4, Vb4-Vd1, Vd1-Vd3, Vd3-Vd2, Vd2-Vd4, Vd4-Va1.

The 16 phase signals are generated at the outputs of the output logic circuit 1201, . . . and 1216 by gating one output signal with its adjacent output signal and with the signal which has 180 degree phase difference to the adjacent output signal.

For example, as shown in FIG. 13, Va1 and Va3 are two adjacent output signals with 22.5 degree phase difference. There is one additional possibility that Va1 and Vb3 are two adjacent output signals with 22.5 degree phase difference in case one of the states, i.e. Va3 flips around. The probability of the flipping around of the states of the output signals will be reduced by how reliable the additional circuit 120 is in initiating the states of the latch circuits to be synchronized. Even though the additional circuit 120 will take care of synchronization and initiating of the states, there is still no 100% guaranty of success. Gating additionally with the signal which has 180 degree phase difference to its adjacent output signal is just to increase the probability of gating of the two output signals which are adjacent. Therefore, the first phase signal is generated at the output of the first output logic circuit 1201 by gating Va1 with Va3 and gating Va1 with Vb3, which has 180 degree phase difference to Va3.

This is realized by using one OR gate between an output signal and its adjacent signal, and one OR gate between the output signal and its adjacent signal's 180 degree out of phase signal, and then NAND the results of the two OR gates. This logical operation may be expressed by:

$$Out_1 = \overline{(Va1+Va3) \cdot (Va1+Vb3)}$$

These relations are applied to the output signals to generate other phase signals, expressed by:

$$Out_2 = \overline{(Va3+Va2) \cdot (Va3+Vb2)}$$

$$Out_3 = \overline{(Va2+Va4) \cdot (Va2+Vb4)}$$

$$Out_4 = \overline{(Va4+Vc1) \cdot (Va4+Vd1)}$$

$$Out_5 = \overline{(Vc1+Vc3) \cdot (Vc1+Vd3)}$$

$$Out_6 = \overline{(Vc3+Vc2) \cdot (Vc3+Vd2)}$$

$$Out_7 = \overline{(Vc2+Vc4) \cdot (Vc2+Vd4)}$$

$$Out_8 = \overline{(Vc4+Vb1) \cdot (Vc4+Va1)}$$

$$Out_9 = \overline{(Vb1+Vb3) \cdot (Vb1+Va3)}$$

$$Out_{10} = \overline{(Vb3+Vb2) \cdot (Vb3+Va2)}$$

$$Out_{11} = \overline{(Vb2+Vb4) \cdot (Vb2+Va4)}$$

$$Out_{12} = \overline{(Vb4+Vd1) \cdot (Vb4+Vc1)}$$

$$Out_{13} = \overline{(Vd1+Vd3) \cdot (Vd1+Vc3)}$$

$$Out_{14} = \overline{(Vd3+Vd2) \cdot (Vd3+Vc2)}$$

$$Out_{15} = \overline{(Vd2+Vd4) \cdot (Vd2+Vc4)}$$

$$Out_{16} = \overline{(Vd4+Va1) \cdot (Vd4+Vb1)}$$

The output logic circuits 1201, . . . and 1216 may have the same structures as the output logic circuits 801, . . . and 808 shown in FIG. 10(*a*) and FIG. 10(*b*).

Figure 14:
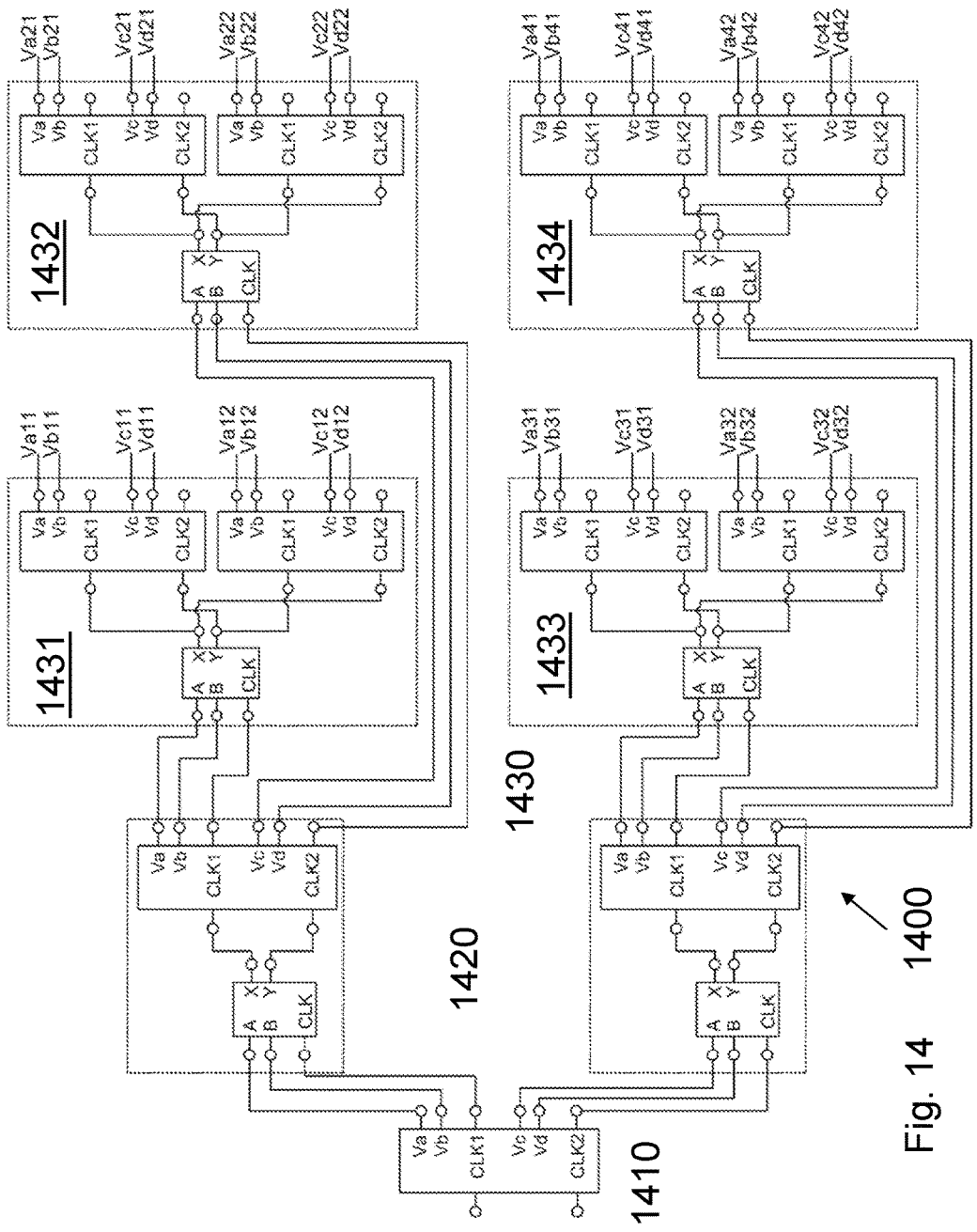
FIG. 14 is a block diagram of another 16-phase signal generator according to the embodiments herein.

FIG. 14 shows another embodiment of a 16-phase signal generator 1400 for generating 16 phase signals with individual phases. In this embodiment, the 16-phase signal generator 1400 comprises 3 stages 1410, 1420 and 1430, i.e. a 3-stage frequency divider. The $2^{nd}$ stage 1420 comprises 2 branches and each branch comprises one 4-phase signal generator. The $3^{rd}$ stage 1430 comprises 4 branches 1431, 1432, 1433 and 1434 and each branch comprises two 4-phase signal generators, so there are eight 4-phase generators in total at the $3^{rd}$ stage.

The 16-phase signal generator 1400 is configured to generate 32 output signals with a frequency of $f_{CLK}/8$ at the outputs of the 4-phase generators in the $3^{rd}$ stage, and the 32 output signals are adjacent to each other with 22.5 degree relative phase shift in the following sequence Va11-Va31, Va12-Va32, Va21-Va41, Va22-Va42; Vb11-Vb31, Vb12-Vb32, Vb21-Vb41, Vb22-Vb42; Vc11-Vc31, Vc12-Vc32, Vc21-Vc41, Vc22-Vc42; Vd11-Vd31, Vd12-Vd32, Vd21-Vd41, Vd22-Vd42.

The 16 phase signals are generated by gating two adjacent output signals, i.e. NOR gating the four outputs from the first 4-phase signal generator in the first branch 1431 with the four outputs from the first 4-phase signal generator in the third branch 1433, and NOR gating the four outputs from the second 4-phase signal generator in the first branch 1431 with the four outputs from the second 4-phase signal generator in the third branch 1433.

Furthermore by NOR gating the four outputs from the first 4-phase signal generator in the second branch 1432 with the four outputs from the first 4-phase signal generator in the fourth branch 1434, and NOR gating the four outputs from the second 4-phase signal generator in the second branch 1432 with the four outputs from the second 4-phase signal generator in the fourth branch 1434. NOR gating of the two adjacent signals is expressed in the following expressions:

$$Out_1 = Va11 \text{ NOR } Va31$$

$$Out_2 = Va12 \text{ NOR } Va32$$

$$Out_3 = Va21 \text{ NOR } Va41$$

$$Out_4 = Va22 \text{ NOR } Va42$$

$$Out_5 = Vb11 \text{ NOR } Vb31$$

$$Out_6 = Vb12 \text{ NOR } Vb32$$

$$Out_7 = Vb21 \text{ NOR } Vb41$$

$$Out_8 = Vb22 \text{ NOR } Vb42$$

$$Out_9 = Vc11 \text{ NOR } Vc31$$

$$Out_{10} = Vc12 \text{ NOR } Vc32$$

$$Out_{11} = Vc21 \text{ NOR } Vc41$$

$$Out_{12} = Vc22 \text{ NOR } Vc42$$

$$Out_{13} = Vd11 \text{ NOR } Vd31$$

$$Out_{14} = Vd12 \text{ NOR } Vd32$$

$$Out_{15} = Vd21 \text{ NOR } Vd41$$

$$Out_{16} = Vd22 \text{ NOR } Vd42$$

To summarise the discussions above, some advantages of the various embodiments of the electronic latch circuit 100, the multi-stage frequency dividers and the poly-phase generators will be enclosed.

These advantages for the electronic latch circuit 100, the 4-phase signal generator 300, the frequency divider 500, and the poly-phase generators 800, 1100, 1200 and 1400 according to the embodiments herein include:

- The function of the electronic latch circuit 100 is less dependent on current than Current Mode Logic, CML circuits and the operation is mainly based on voltage switching of the active devices, hence enlarging the size of the transistors to boost the current capability is not as important as in the CML circuits so far necessary transconductance $g_m$ is provided by the technology. Therefore jitter noise of the electronic latch circuit 100 can be made lower than the CML circuits for the same power consumption.
- There is not a direct current path between the power supply and the ground under any time or signal events in these embodiments.
- The 4-phase generator 300 according to embodiments herein may provide four phase signals at high clock frequency as the total active device periphery tends to be relatively small and amount of parasitic tends to be less.
- The multi-stage frequency dividers and the poly-phase signal generators 500, 700, 800, 1100, 1200 and 1400 built by the electronic latch circuit 100 and the 4-phase signal generator 300 are relatively compact, state-stable, power efficient and able of high speed operation.

The structure and connection of the multi-stage frequency divider and the poly-phase signal generator are generic and are capable of performing both division and generation of phases.

Figure 15:
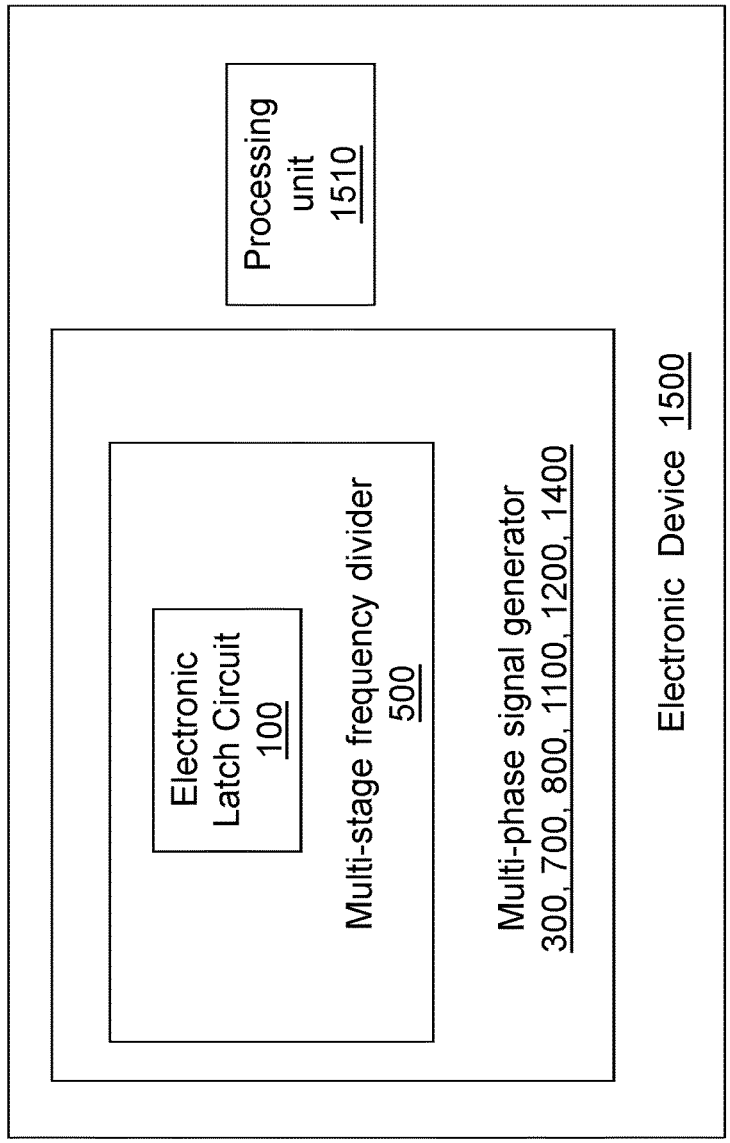
FIG. 15 is a block diagram illustrating an electronic device in which the embodiments herein may be implemented.

The electronic latch circuit 100, the multi-stage frequency divider 500 and the poly-phase generators 300, 700, 800, 1100, 1200 and 1400 according to the embodiments herein may be employed in various electronic devices. FIG. 15 shows a block diagram for an electronic device 1500, which may be, e.g. a radio frequency transceiver, a wireless communication device, a user equipment or a mobile device and/or a base station or any general electronic circuit or equipment, such as a measurement equipment or instrument, an oscillator scope etc. The electronic device 1500 may comprise other units, where a processing unit 1510 is shown.

Those skilled in the art will understand that although transistors in the electronic latch circuit 100 as shown in FIG. 1 are Metal Oxide Semiconductor Field Effect transistors, MOSFET, any other types of transistors, e.g. Metal Semiconductor Field Effect Transistors, MESFET, Junction Field Effect Transistors, JFET, Bipolar Junction Transistors, BJT etc., may be comprised in the electronic latch circuit 100. When using the word "comprise" or "comprising" it shall be interpreted as non-limiting, i.e. meaning "consist at least of".

Moreover it will be understood that in general in accordance with aspects of this invention, the functionality in the invention scope may still be achieved by interchanging supply-reference voltage polarity and/or interchanging P-type of active device with N-type, and/or implementation in conjunction with aforementioned technologies.

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A multi-stage frequency divider comprising:
   a first stage comprising a 4-phase signal generator; and
   a plurality N of cascaded stages, each stage comprising $2^{N-1}$ branches, wherein N=2, 3, . . . ; and wherein each branch comprises:
   an electronic latch circuit; and
   a first 4-phase signal generator; and wherein in each branch:
   the first and second inputs of the electronic latch circuit is connected to a pair of the output signals at the outputs of the 4-phase signal generator in the stage preceding it; and
   the first and second outputs of the electronic latch circuit is connected to the first and second clock signal inputs of the first 4-phase signal generator in the same branch; and the clock signal input of the electronic latch circuit is connected to the first or second clock signal input of the 4-phase signal generator in the stage preceding it.

2. The multi-stage frequency divider according to claim 1, is further configured to:
   receive a first clock signal with a frequency of $f_{CLK}$ at the first clock signal input of the 4-phase generator in the first stage;
   receive a second clock signal which is an inverse polarity of the first clock signal at the second clock signal input of the 4-phase generator in the first stage; and
   generate output signals at the $N^{th}$ stage with a frequency of $f_{CLK}/2^N$ at the outputs of each 4-phase generator in the $N^{th}$ stage, wherein N=2, 3, . . . .

3. The multi-stage frequency divider according to claim 1, wherein each branch in any one of the stages further comprises a second 4-phase signal generator, and wherein the first and second clock signal inputs of the second 4-phase signal generator are respectively connected to the second and first clock signal inputs of the first 4-phase signal generator such that the clock signals at the inputs of the first and second 4-phase signal generators are inverse in polarity with respect to each other.

\* \* \* \* \*